US012656526B2

(12) United States Patent
De Waele et al.

(10) Patent No.: US 12,656,526 B2
(45) Date of Patent: Jun. 16, 2026

(54) GEOLOGICAL REASONING WITH GRAPH NETWORKS FOR HYDROCARBON IDENTIFICATION

(71) Applicant: ExxonMobil Technology and Engineering Company, Spring, TX (US)

(72) Inventors: Stijin De Waele, Flemington, NJ (US); Huseyin Denli, Basking Ridge, NJ (US); Peng Xu, Annadale, NJ (US); Mary K. Johns, Houston, TX (US)

(73) Assignee: ExxonMobil Technology and Engineering Company, Spring, TX (US)

( * ) Notice: Subject to any disclaimer, the term of this patent is extended or adjusted under 35 U.S.C. 154(b) by 827 days.

(21) Appl. No.: 17/922,838

(22) PCT Filed: Apr. 19, 2021

(86) PCT No.: PCT/US2021/070418
§ 371 (c)(1),
(2) Date: Nov. 2, 2022

(87) PCT Pub. No.: WO2021/226612
PCT Pub. Date: Nov. 11, 2021

(65) Prior Publication Data
US 2023/0168410 A1 Jun. 1, 2023

Related U.S. Application Data

(60) Provisional application No. 62/704,357, filed on May 6, 2020.

(51) Int. Cl.
*G01V 20/00* (2024.01)
*G06F 30/27* (2020.01)

(52) U.S. Cl.
CPC .............. *G01V 20/00* (2024.01); *G06F 30/27* (2020.01)

(58) Field of Classification Search
CPC .... G01V 1/345; G01V 20/00; G01V 2210/64; G06F 30/27
See application file for complete search history.

(56) References Cited

U.S. PATENT DOCUMENTS

2013/0064040 A1* 3/2013 Imhof .................... G01V 1/306
367/73
2013/0338987 A1 12/2013 Cheng et al.
(Continued)

FOREIGN PATENT DOCUMENTS

WO 2012102784 A1 8/2012
WO 2015030811 A1 3/2015

OTHER PUBLICATIONS

International Search Report for PCT application No. PCT/US2021/070418 mailed Nov. 11, 2021.
(Continued)

*Primary Examiner* — Michael J Dalbo
(74) *Attorney, Agent, or Firm* — Lempia Summerfield Katz LLC

(57) ABSTRACT

A method and apparatus for performing geological reasoning, A method includes: obtaining subsurface data for a subsurface region; obtaining a knowledge model; extracting a structured representation from the subsurface data using the knowledge model; and performing geological reasoning with a graph network based on the knowledge model and the structured representation. A method includes performing geological reasoning with a knowledge model that includes a set of geoscience rules or a geoscience ontology. A method includes performing geological reasoning with a structured representation that includes a graph. A method includes performing geological reasoning by one or more of the
(Continued)

following: question answering; decision making; assigning ranking; and assessing probability.

23 Claims, 11 Drawing Sheets

(56) References Cited

U.S. PATENT DOCUMENTS

| | | | | |
|---|---|---|---|---|
| 2014/0118350 | A1* | 5/2014 | Imhof | G01V 1/325 |
| | | | | 345/424 |
| 2014/0278115 | A1* | 9/2014 | Bas | G01V 20/00 |
| | | | | 702/14 |
| 2016/0170087 | A1 | 6/2016 | Yarus et al. | |
| 2019/0064378 | A1 | 2/2019 | Liu et al. | |
| 2019/0107642 | A1* | 4/2019 | Farhadi Nia | G06N 3/088 |
| 2020/0284936 | A1* | 9/2020 | da Silva Ferreira ... | G01V 1/302 |
| 2021/0064651 | A1* | 3/2021 | Ashton Vital Brazil | .................... |
| | | | | G06F 17/18 |
| 2021/0223423 | A1* | 7/2021 | Griffith | G06N 3/02 |
| 2021/0319304 | A1* | 10/2021 | Tawil | G01V 1/48 |

OTHER PUBLICATIONS

Written Opinion for PCT application No. &nbsp;PCT/US2021/070418 mailed Nov. 11, 2021.

* cited by examiner

500-B

GEOLOGICAL REASONING WITH GRAPH NETWORKS FOR HYDROCARBON IDENTIFICATION

CROSS REFERENCE TO RELATED APPLICATIONS

This application claims the benefit of U.S. Provisional Application 62/704,357, filed May 6, 2020, the entirety of which is incorporated by reference herein.

FIELD

This disclosure relates generally to the field of geophysical prospecting and, more particularly, to prospecting for hydrocarbon and related data processing. Specifically, exemplary embodiments relate to methods and apparatus for improving computational efficiency by using geological reasoning with graph networks for hydrocarbon identification.

BACKGROUND

This section is intended to introduce various aspects of the art, which may be associated with exemplary embodiments of the present disclosure. This discussion is believed to assist in providing a framework to facilitate a better understanding of particular aspects of the present disclosure. Accordingly, it should be understood that this section should be read in this light, and not necessarily as admissions of prior art.

An important goal of geophysical prospecting is to accurately detect, locate, identify, model, and/or quantify subsurface structures and likelihood of hydrocarbon occurrence. For example, seismic data may be gathered and processed to generate subsurface models. Seismic prospecting is facilitated by acquiring raw seismic data during performance of a seismic survey. The seismic data is processed in an effort to create an accurate mapping (e.g., an image and/or images of maps, such as 2-D or 3-D images presented on a display) of the subsurface region. The processed data is then examined (e.g., analysis of images from the mapping) with a goal of identifying geological structures that may contain hydrocarbons.

Geophysical data (e.g., acquired seismic data, acquired electromagnetic data, reservoir surveillance data, etc.) may be analyzed to develop subsurface models. For example, seismic interpretation may be used to infer geology (e.g., subsurface structures) and hydrocarbon-bearing reservoirs from seismic data (e.g., seismic images or geophysical and petrophysical models). For example, structural interpretation generally involves the interpretation of subsurface horizons (e.g. boundaries between formations), geobodies (e.g. salt anomaly), and/or faults from subsurface images (such as, e.g., pre-stack or partial-stack seismic images or attributes derived from seismic images). Structural interpretation is currently one of the laborious tasks that typically takes months of interpreters' time. As such, structural interpretation is one of the key bottlenecks in the interpretation workflow.

While machine learning techniques may provide some structural interpretation assistance, difficulties remain. For example, many modern machine learning approaches, such as deep learning, follow an "end-to-end" design philosophy. As such, emphasis is not placed on the compositional nature of a problem, making minimal a priori representational assumptions and avoiding explicit structures. These approaches work best when data and computing resources are abundantly available. For example, many modern machine learning approaches would attempt to learn the tasks (e.g., low-level geologic classification and segmentation of subsurface images) and extract low level features of the subsurface (e.g. geological fault detection) from seismic images. Such approaches are challenged by reasoning about the relationships among such low level features, are ill-equipped to learn from small amounts of experience or examples, have difficulty building intuition about a task or environment, and/or fail to make an analogy among tasks, features, and/or problems.

Consequently, many machine learning approaches are not capable of answering questions about a hydrocarbon prospect. Such decision making involves knowledge-intensive reasoning processes, which are conventionally based on a geoscientist's mental images, inductive models, and/or biases. Therefore, more efficient equipment and techniques of seismic interpretation with geological reasoning would be beneficial.

Background references may include the PCT Publication WO 2014/1502626 A1 and the non-patent literature references Anderson et al, (2018) "*Bottom-up and top-down attention for image captioning and visual question answering*", 2018 IEEE/CVF Conference on Computer Vision and Pattern Recognition, pp. 6077-6086, doi: 10.1109/CVPR.2018.00636; Andryehowicz et al. (2016) "*Learning to learn by gradient descent by gradient descent*", 30th Conference on Neural Information Processing Systems (NIPS 2016), pp. 3988-3996, doi: 10.5555/3157382.3157543; Battaglia et al. (2018) "*Relational inductive biases, deep learning, and graph net-works*". pp. 1-40 arXiv preprint arXiv: 1806.01261; Finn et al. (2017) "*Model-Agnostic Meta-Learning for Fast Adaptation of Deep Networks*", Proceedings of the 34th International Conference on Machine Learning, Sydney, Australia, PMLR 70, pp. 1-10 Goodfellow et al, (2016) "*Deep learning*", MIT press, pp. i-vii, 369-372, and 555-586; Daniel Müllner (2011) "*Modern hierarchical, agglomerative clustering algorithms*" arXiv preprint arXiv: 1109.2378, pp. 1-29; Yosinski et al. (2014) "*How transferable are features in deep neural networks?*", Advances in Neural Information Processing Systems (NIPS), pp. 3320-3328; Zhang et al. (2018) "*Variational Reasoning for Question Answering with Knowledge Graph*", The Thirty-Section AAAI Conference on Artificial Intelligence (AAAI-18), pp. 6069-6076 and Zhou et al. (2019) "Graph Neural Networks: A Review of Methods and Applications", arXiv preprint arXiv: 1812.08434, pp. 1-22.

SUMMARY

A method and apparatus for performing geological reasoning. A method includes: obtaining subsurface data for a subsurface region, obtaining a knowledge model, extracting a structured representation from the subsurface data using the knowledge model, and performing geological reasoning based on the knowledge model and the structured representation. A method includes a knowledge model that includes a set of geoscience rules or a geoscience ontology. A method includes a structured representation that includes a graph. A method includes performing geological reasoning by one or more of the following: question answering, decision making, assigning ranking, and assessing probability.

BRIEF DESCRIPTION OF THE DRAWINGS

So that the manner in which the recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, for the disclosure may admit to other equally effective embodiments and applications.

DETAILED DESCRIPTION

Figures 1A, 1B:
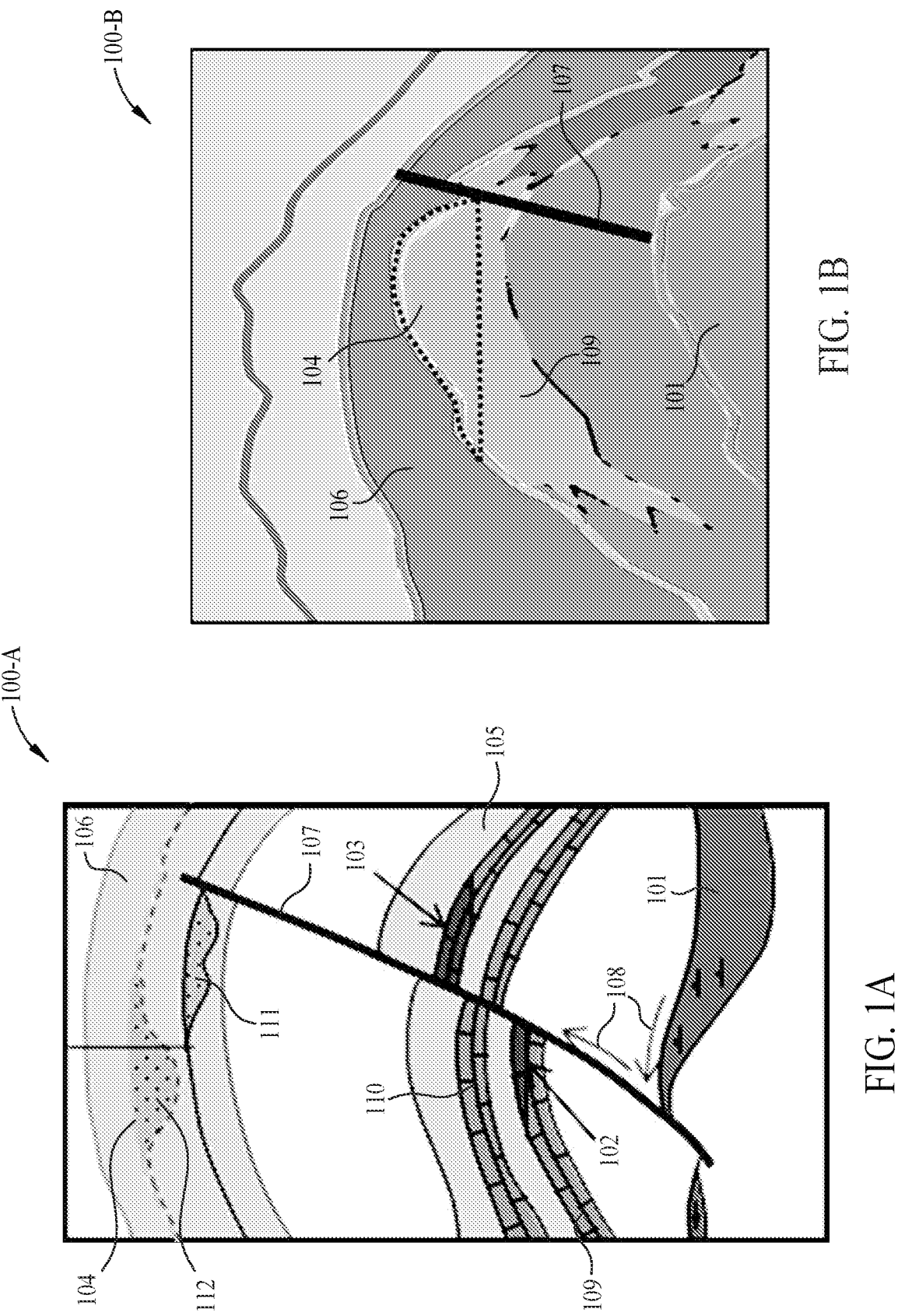
FIG. 1A illustrates an exemplary hydrocarbon system evidencing petroleum system elements (also known as "play elements").
FIG. 1B illustrates another exemplary hydrocarbon system evidencing petroleum system elements.

It is to be understood that the present disclosure is not limited to particular devices or methods, which may, of course, vary. It is also to be understood that the terminology used herein is for the purpose of describing particular embodiments only, and is not intended to be limiting. As used herein, the singular forms "a," "an," and "the" include singular and plural referents unless the content clearly dictates otherwise. Furthermore, the words "can" and "may" are used throughout this application in a permissive sense (i.e., having the potential to, being able to), not in a mandatory sense (i.e., must). The term "include," and derivations thereof, mean "including, but not limited to." The term "coupled" means directly or indirectly connected. The word "exemplary" is used herein to mean "serving as an example, instance, or illustration." Any aspect described herein as "exemplary" is not necessarily to be construed as preferred or advantageous over other aspects. The term "uniform" means substantially equal for each sub-element, within about ±10% variation. The term "nominal" means as planned or designed in the absence of variables such as wind, waves, currents, or other unplanned phenomena. "Nominal" may be implied as commonly used in the fields of seismic prospecting and/or hydrocarbon management.

The term "simultaneous" does not necessarily mean that two or more events occur at precisely the same time or over exactly the same time period. Rather, as used herein, "simultaneous" means that the two or more events occur near in time or during overlapping time periods. For example, the two or more events may be separated by a short time interval that is small compared to the duration of the overall operation. As another example, the two or more events may occur during time periods that overlap by about 40% to about 100% of either period.

The term "seismic data" as used herein broadly means any data received and/or recorded as part of the seismic surveying process, including particle displacement, velocity, and/or acceleration, pressure, reflection, shear, and/or refraction wave data. "Seismic data" is also intended to include any data or properties, including geophysical properties such as one or more of: elastic properties (e.g., P and/or S wave velocity, P-Impedance. S-Impedance, density, attenuation, anisotropy, and the like); seismic stacks (e.g., seismic angle stacks); compressional velocity models; and porosity, permeability, or the like, that the ordinarily skilled artisan at the time of this disclosure will recognize may be inferred or otherwise derived from such data received and/or recorded as part of the seismic surveying process. Thus, the disclosure may at times refer to "seismic data and/or data derived therefrom," or equivalently simply to "seismic data." Both terms are intended to include both measured/recorded seismic data and such derived data, unless the context clearly indicates that only one or the other is intended.

The term "geophysical data" as used herein broadly includes seismic data, as well as other data obtained from non-seismic geophysical methods such as electrical resistivity.

The terms "velocity model," "density model," "physical property model," or other similar terms as used herein refer to a numerical representation of parameters for subsurface regions. Generally, the numerical representation includes an array of numbers, typically a 2-D or 3-D array, where each number, which may be called a "model parameter," is a value of velocity, density, or another physical property in a cell, where a subsurface region has been conceptually divided into discrete cells for computational purposes. For example, the spatial distribution of velocity may be modeled using constant-velocity units (layers) through which ray paths obeying Snell's law can be traced. A 3-D geologic model (particularly a model represented in image form) may be represented in volume elements (voxels), in a similar way that a photograph (or 24) geologic model) is represented by picture elements (pixels). Such numerical representations may be shape-based or functional forms in addition to, or in lieu of, cell-based numerical representations.

As used herein, "hydrocarbon management" or "managing hydrocarbons" includes any one or more of the following: hydrocarbon extraction; hydrocarbon production, (e.g., drilling a well and prospecting for, and/or producing, hydrocarbons using the well; and/or, causing a well to be drilled, e.g., to prospect for hydrocarbons); hydrocarbon exploration; identifying potential hydrocarbon-bearing formations; characterizing hydrocarbon-bearing formations; identifying: well locations; determining well injection rates; determining well extraction rates; identifying reservoir connectivity; acquiring, disposing of, and/or abandoning hydrocarbon resources; reviewing prior hydrocarbon management decisions; and any other hydrocarbon-related acts or activities, such activities typically taking place with respect to a subsurface formation. The aforementioned broadly include not only the acts themselves (e.g., extraction, production, drilling a well, etc.), but also or instead the direction and/or causation of such acts (e.g., causing hydrocarbons to be extracted, causing hydrocarbons to be produced, causing a well to be drilled, causing the prospecting of hydrocarbons, etc.).

As used herein, "obtaining" data generally refers to any method or combination of methods of acquiring, collecting, or accessing data, including, for example, directly measuring or sensing a physical property, receiving transmitted data, selecting data from a group of physical sensors, identifying data in a data record, and retrieving data from one or more data libraries. For example, a seismic survey may be conducted to acquire the initial data (which may also or instead include obtaining other geophysical data in addition or, or instead of, seismic data such as obtaining electrical resistivity measurements). Models may be utilized to generate synthetic initial data (e.g., computer simulation). In some embodiments, the initial data may be obtained from a library of data from previous seismic surveys or previous computer simulations. In some embodiments, a combination of any two or more of these methods may be utilized to generate the initial data.

The term "label" generally refers to identifications and/or assessments of correct or true outputs provided for a given set of inputs. Labels may be of any of a variety of formats, including text labels, data tags (e.g., binary value tags), pixel attribute adjustments (e.g., color highlighting), n-tuple label (e.g., concatenation and/or array of two or more labels), etc.

The term "geological reasoning" refers to a variety of tasks related to identifying and/or localizing hydrocarbon system elements (e.g., trap, reservoir, seal, migration pathways, water-hydrocarbon contact surfaces, source rock etc.), inferring relationships among hydrocarbon system elements, and/or quantifying hydrocarbon accumulations, or probabilities thereof, in subsurface regions. Such tasks may include question answering, decision making, assigning ranking, assessing probability, and other reasoning tasks that ultimately facilitate hydrocarbon management.

If there is any conflict in the usages of a word or term in this specification and one or more patent or other documents that may be incorporated herein by reference, the definitions that are consistent with this specification should be adopted for the purposes of understanding this disclosure.

One of the many potential advantages of the embodiments of the present disclosure is that geological reasoning with graph networks may efficiently analyze a hydrocarbon system. Under conventional approaches to hydrocarbon system interpretation, a domain expert (such as a geoscientist or an interpreter) extracts information from available subsurface data and subjectively synthesizes the extracted information based on his/her knowledge. However, the amount of available information could be overwhelming for one expert, or even a team of experts. Embodiments of the present disclosure may more optimally extract and combine information to reason about a hydrocarbon system more effectively.

Another potential advantage includes the ability to generate multiple scenarios. Because geophysical data can be ambiguous, multiple interpretations may fit the same data. Moreover, a single interpretation may not be able to fully explain all of the observations of the subsurface. Therefore, generating multiple scenarios from the same data set may better characterize the subsurface. In some embodiments, the multiple scenarios may be labeled, tagged, and/or ranked based on a probability rating. Generating and/or ranking multiple scenarios can be physiologically difficult for a domain expert, because the expert reasons with his/her biases which may, at times, be inconsistent with the data and/or subsurface realities. Embodiments of the present disclosure may generate multiple scenarios having various probability weights.

Another potential advantage includes geological reasoning based on a relatively small set of labeled training data. Unstructured approaches (e.g., pixel-based approaches such as convolutional neural networks) typically require a large amount of labeled training data (e.g., seismic images with labels of geologic objects such as faults). This amount of training data may not be available for many types of subsurface formations. Geological reasoning with graph networks may be able to infer hydrocarbon location and/or quantity based on a relatively small set of labeled training data.

Another potential advantage includes overcoming difficulties with generalization. Many inference algorithms generalize poorly to a larger set of data instances and distributions. For example, a system trained on the seismic data from one basin may not be able to generalize that training to another basin. Retraining the inference system for the new basin would likely involve extensive additional effort, for example to analyze and label data from the new basin. Embodiments of the present disclosure may overcome such difficulties with generalization.

Other potential advantages will be apparent to the skilled artisan with the benefit of this disclosure. Embodiments of the present disclosure can thereby be useful in the discovery and/or extraction of hydrocarbons from subsurface formations.

Geoscientific knowledge (e.g. as conveyed in a seismic image) is compositional in nature and has structure. For example, the hydrocarbon system 100-A illustrated in FIG. 1A evidences petroleum system elements (also known as "play elements"), such as source 101, traps 102, 103, 104, seals 105, 106, fault 107, migration pathways 108, and reservoirs 109, 110, 111, 112. A geoscientist typically utilizes mature geoscientific knowledge to identify such elements and establish relationships thereamong. For example, geoscientific knowledge may provide expectations such as (1) a seal is above a trap, (2) a source is below a reservoir, (3) fluid contacts wrap around the trap, (4) the reservoir is co-located in the trap, and (5) the reservoir is connected across the fault. When interpreting new information and/or analyzing a new hydrocarbon prospect, a geoscientist either fits new observations into prior structured representations (e.g. geoscience ontology), or he/she adjusts the structure of the representations to accommodate the new observations. The structured representations may thereby provide valuable inductive biases to enhance the reasoning process.

Likewise, the compositional nature of geoscientific knowledge is illustrated as hydrocarbon system 100-B in FIG. 1B. A geoscientist has labeled the play elements of hydrocarbon system 100-B, such as source 101, trap 104, seal 106, fault 107, and reservoirs 109, 110, 111, 112.

Figure 2:
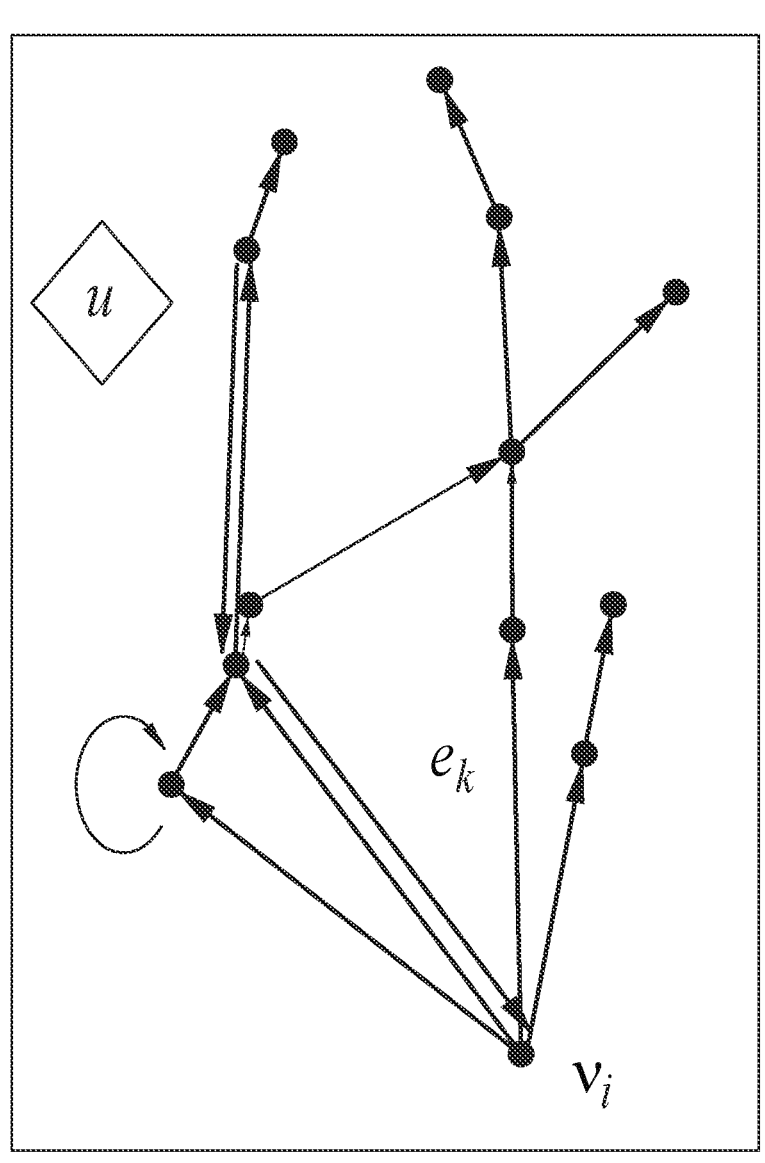
FIG. 2 illustrates an exemplary graph.

Embodiments disclosed herein may utilize graphs to represent and/or employ geoscientific knowledge. An exemplary graph 200 is illustrated in FIG. 2. In graph theory, a graph structure includes a set of objects. Some pairs of the objects are in some sense "related." The objects are referred to as vertices (also called nodes or points). A vertex $v_i$ is illustrated in FIG. 2. Each of the related pairs of vertices define an edge (also called a link or line). An edge $e_k$ is illustrated in FIG. 2. The edges may be directed or undirected, and any pair of vertices may have multiple edges. All of the edges illustrated in FIG. 2 are directed. The direction of an edge may thereby define a sender node (or source node) and a receiver node. FIG. 2 also illustrates a global (i.e., graph-level) attribute u. Generally, attributes may be encoded as a vector, set, or another graph. Vertices and edges may also have associated attributes.

In some embodiments, geologic object attributes and their relationships may not be uniform. For example, source 101 in FIG. 1A and FIG. 1B may be a three-dimensional volume object, while fault 107 may be a three-dimensional surface object. Thus, attribute types (e.g., length, surface, or volume) may depend on the object type. Some embodiments may include systems and methods configured to accept and/or process heterogeneous object types.

Figure 3A:
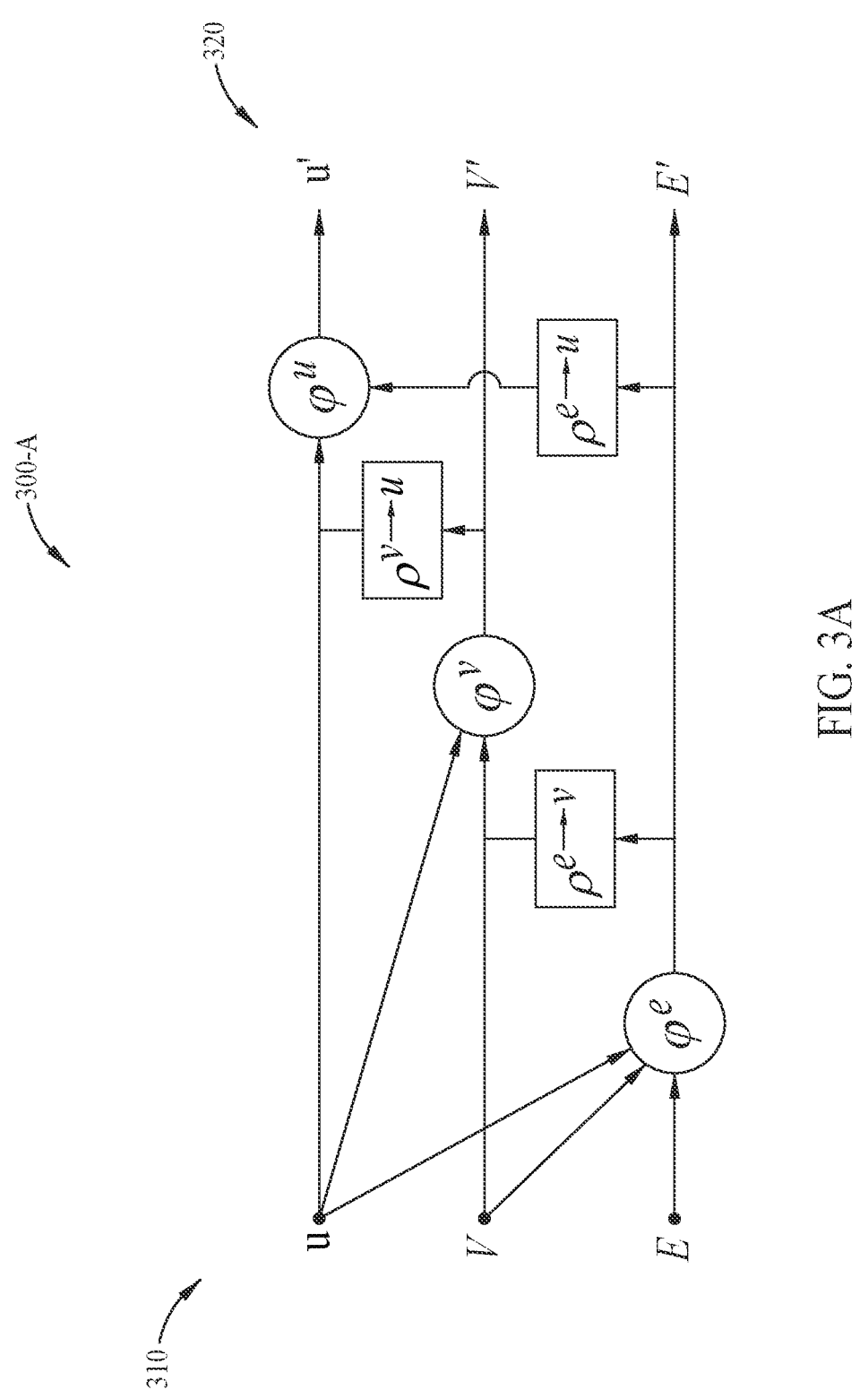
FIG. 3A illustrates an exemplary graph network.

Some embodiments of the present disclosure utilize machine reasoning approaches based on graph networks. A graph network may be generally described as a computational framework for entity- and/or relation-based reasoning operating on graphs. An exemplary graph network 300-A is illustrated in FIG. 3A. Graph networks may utilize structured data to infer new information from this structured data. Computational frameworks for graph networks include, for example, graph neural networks, message-passing graphs, relational graphs, and graph autoencoders. More particularly, a graph neural network may be described as a connectionist model that captures the dependence(s) of graphs via message passing between the nodes of the graphs.

As illustrated in FIG. 3A, graph network 300-A operates on a graph, described by input 310, including structure and attributes {E,V,u}. Graph network 300-A thereby produces output 320, including new attributes for the same graph, {E',V',u'}. Graph networks may be trained based on geoscientific knowledge to perform geological reasoning. For example, a trained graph network may predict the amount of hydrocarbon accumulations for each reservoir node as V'.

In some embodiments, a graph network may include an edge update function $\varphi^e$. For example, edge update function $\varphi^e$ may identify an edge attribute in the input graph that is ordered (e.g., serial progression of the values of a parameter along a path between the two objects). When an attribute is ordered, a Recurrent Neural Network (RNN) may be utilized to process the respective attribute. In some embodiments, ordering information may be provided by an expert (e.g., by tagging training data with ordering labels). In some embodiments, ordering information may be expressed in an ontology, as further described below.

In some embodiments, an edge update function may extract a number of deposition layers traversed by an edge attribute. For example, the edge update function may identify a number of jumps detected in the signal.

In some embodiments, graph network blocks may be stacked for geological reasoning. For example, graph network blocks may be stacked in series, in parallel, or in a combination thereof. Stacked graph networks may form a multi-block architecture. For example, a number of graph networks can be stacked in series to form a multi-block architecture.

In some embodiments, a graph network, and/or a graph network block, may be utilized to generate categorical output (e.g. the presence of play elements, as illustrated in FIG. 1A and FIG. 1B). Generally, categorical output may be represented as a variable that can take on one of a limited, and usually fixed, number of possible values. For example, for each input node V, the output node V may include a vector of probabilities that the input node V represents a certain play element. Attributes of output edge E' may include the probability that the input edge E represents part of a migration pathway. Alternatively, attributes of output edge E' may represent conditional probabilities for play elements, providing a Bayesian Network as an output. Utilizing probability graphs may allow for expression of dependencies between identification of play elements, which allows for expression of multiple scenarios. For example, the probability that an object is a reservoir can be conditioned on whether an object located below the potential reservoir is the source. Likewise, the probability that an object is a reservoir may be conditioned on whether a fault is a migration pathway. In some embodiments, the graph network may be trained with additional samples to learn expression of multiple scenarios.

In some embodiments, a graph network, and/or a graph network block, may be utilized to generate numerical output (e.g. a predicted amount of hydrocarbons in a subsurface region). For example, an attribute of the output node V' may be the predicted amount of hydrocarbons associated with the input node V if the input node V includes a reservoir attribute.

Figure 3B:
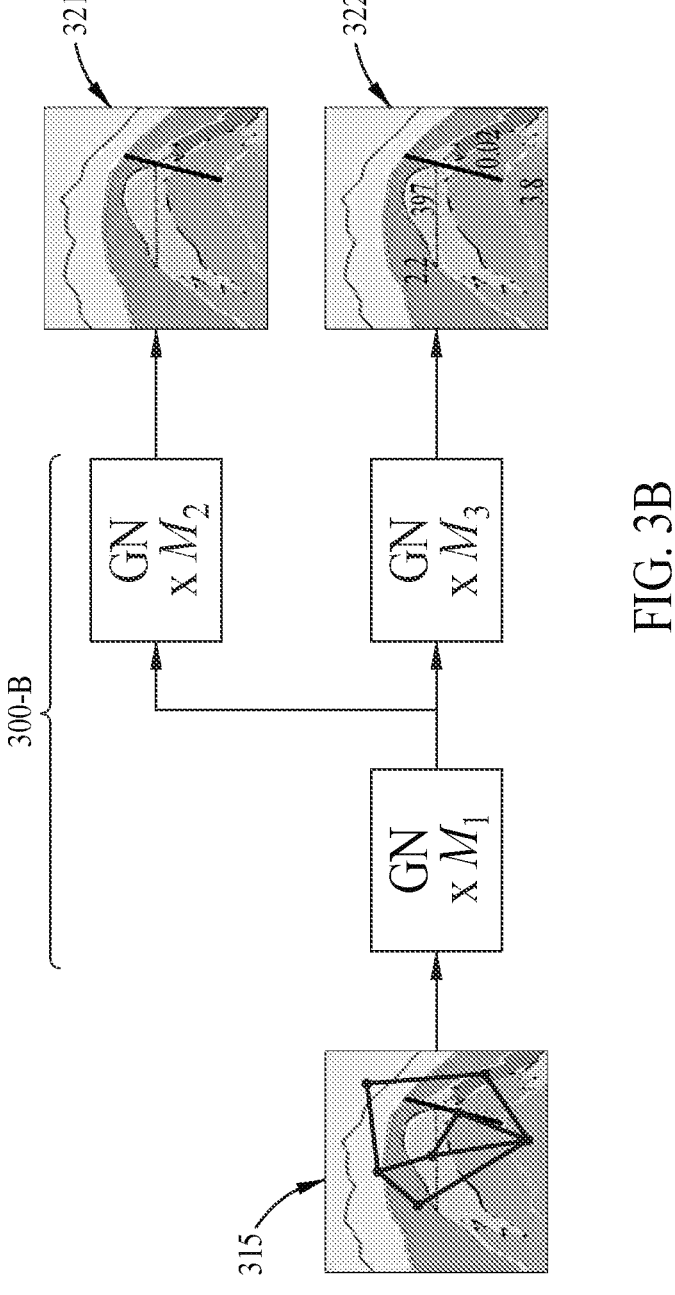
FIG. 3B illustrates utilizing a graph network to generate both categorical output and numerical output.

FIG. 3B illustrates utilizing a graph network 300-B to generate both categorical output and numerical output representative of the presence of play elements, as illustrated in FIG. 1B. For example, input graph 315 may include the hydrocarbon system 100-B from FIG. 1B. Input graph 315 may have extracted objects, as discussed below. Graph network 300-B may generate output graph 321 categorically identifying play elements associated with various regions of the graph. Graph network 300-B may also generate output graph 322 identifying numeric estimations of the amount of hydrocarbon accumulation in each of the regions of the seismic image. As illustrated, parameters of the $M_1$ graph network of graph network 300-B may be shared with both the $M_2$ graph network and the $M_3$ graph network. Sharing parameters may enhance performance of the overall geological reasoning system, at least in part due to the strong dependence between the presence of play elements and the hydrocarbon accumulation amount.

Figure 3D:
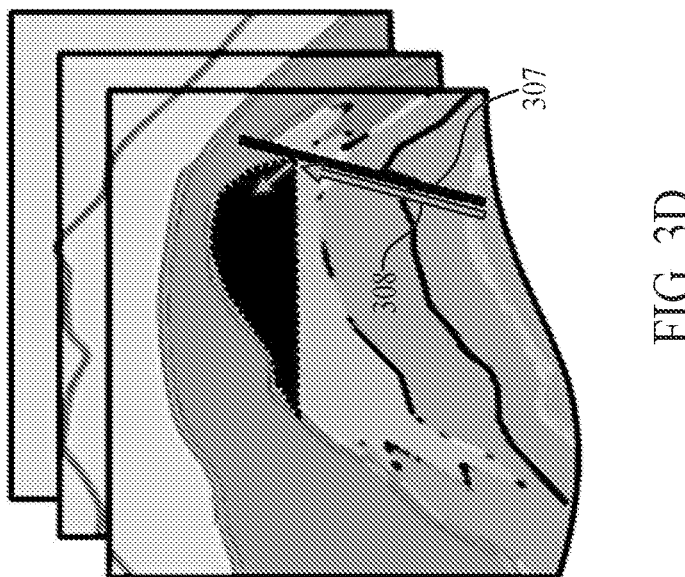
FIG. 3D further illustrates utilizing a graph network to generate probability graphs.
Figure 3C:
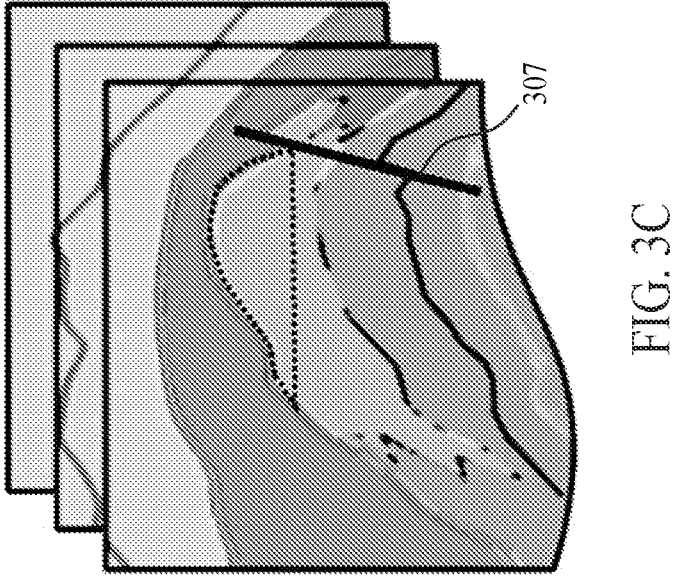
FIG. 3C illustrates utilizing a graph network to generate probability graphs.

FIG. 3C and FIG. 3D illustrate utilizing graph network 300-B to generate probability graphs that allow for expression of dependencies between identification of play elements, which allows for expression of multiple scenarios. FIG. 3C illustrates a scenario wherein an identified fault 307 is not a migration pathway. FIG. 3D illustrates a related scenario wherein an identified fault 307 is a migration pathway 308. Because geophysical data can be ambiguous, multiple interpretations may fit the same data. Since the probability that an object is a reservoir may be conditioned on whether a fault is a migration pathway, FIG. 3D provides a higher probability of hydrocarbon accumulation than FIG. 3C. Graph network 300-B may be trained to learn expression of such multiple scenarios.

Machine reasoning approaches based on graph networks tend to rely heavily on objects (e.g., nodes) and relationships (e.g., edges). However, seismic data, being largely unstructured, does not directly represent geologic objects of interest. Embodiments disclosed herein may resolve this technical challenge of a dearth of objects in seismic data. Embodiments disclosed herein may also resolve the technical challenge of a lack of relationships between objects in seismic data.

Figure 4:
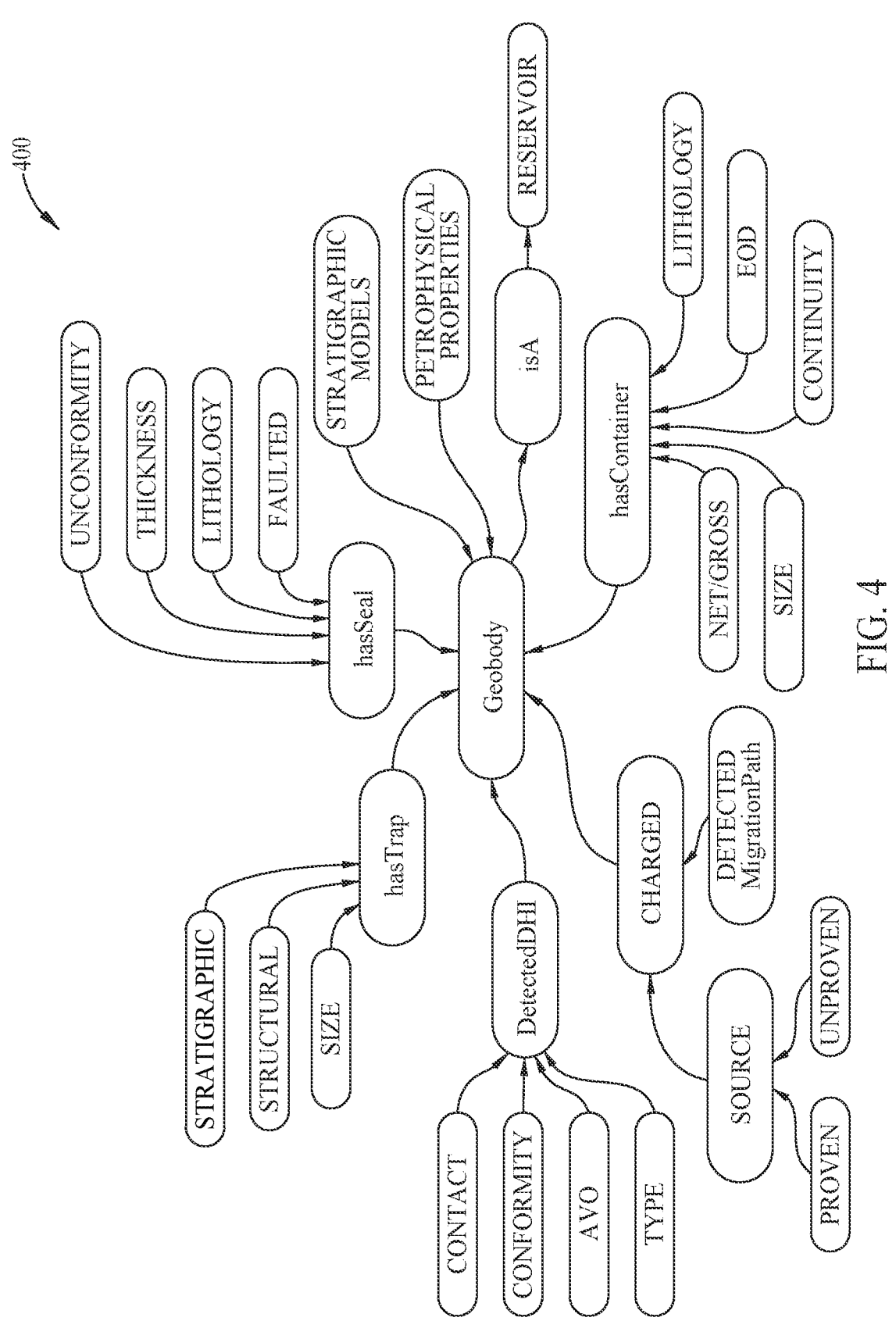
FIG. 4 illustrates an exemplary ontology.

Embodiments disclosed herein may design knowledge models for geological reasoning problems. For example, a knowledge model may be based on a geoscience ontology which organizes the compositional nature of geoscientific knowledge and/or reasoning about a hydrocarbon system. For example, a geoscience ontology may include a set of geoscience concepts and categories that represents certain properties and the relations between associated properties. An exemplary ontology 400 is illustrated in FIG. 4. Based on such organization, a graph network may infer new information from an input of structured data (e.g., based on geoscience ontology) using a set of weights (e.g., network parameters). For example, the weights may be determined by training. The network parameters may include node, edge parameters and types, global parameters and types, and/or accumulation function parameters and types. In some embodiments, a knowledge model may be based on a set of geoscience rules. For example, a knowledge model may include rules that identify a probable trap. Moreover, the knowledge model may include rules that instruct a user when there is a probable trap without the user asking for it.

Some embodiments utilize geologic reasoning with seismic data and/or contextual information. Contextual information includes, for example, text and/or visual representations of a known geology of a basin. Contextual information may also include, for example, inductive models based on text and/or visual representations of a known geology of a basin. In some embodiments, neural networks (e.g., convolutional neural networks) may employ data-driven methods to accomplish geologic reasoning with seismic data and/or contextual information.

Figure 5A:
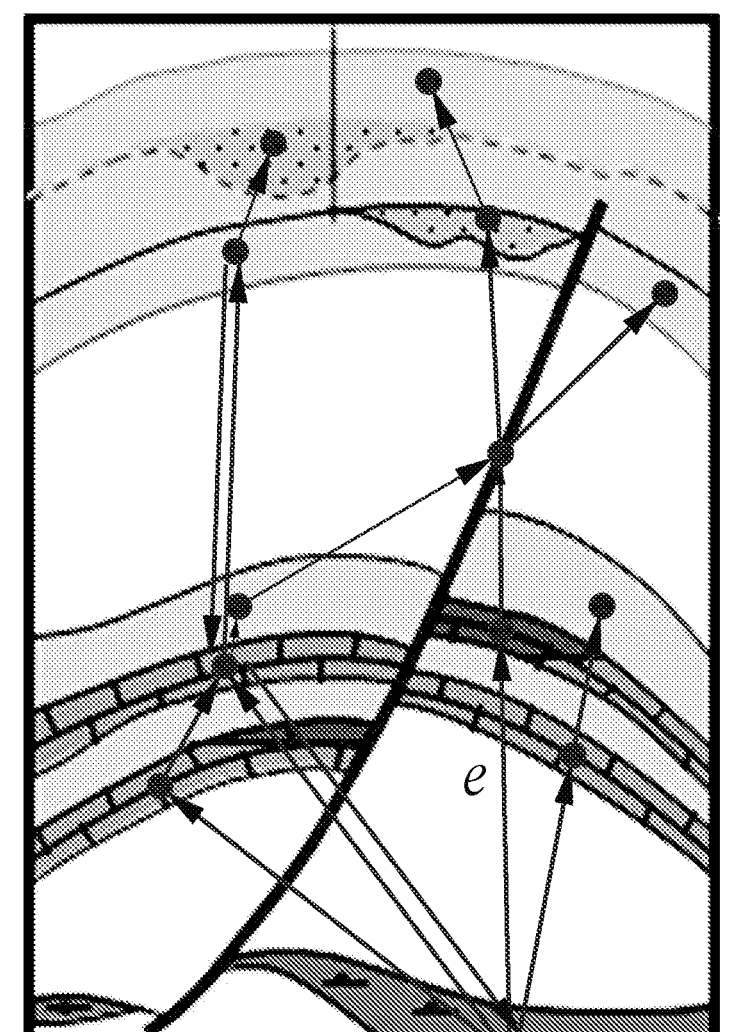
FIG. 5A illustrates the hydrocarbon system from FIG. 1A with an exemplary graph overlay.
Figure 5B:
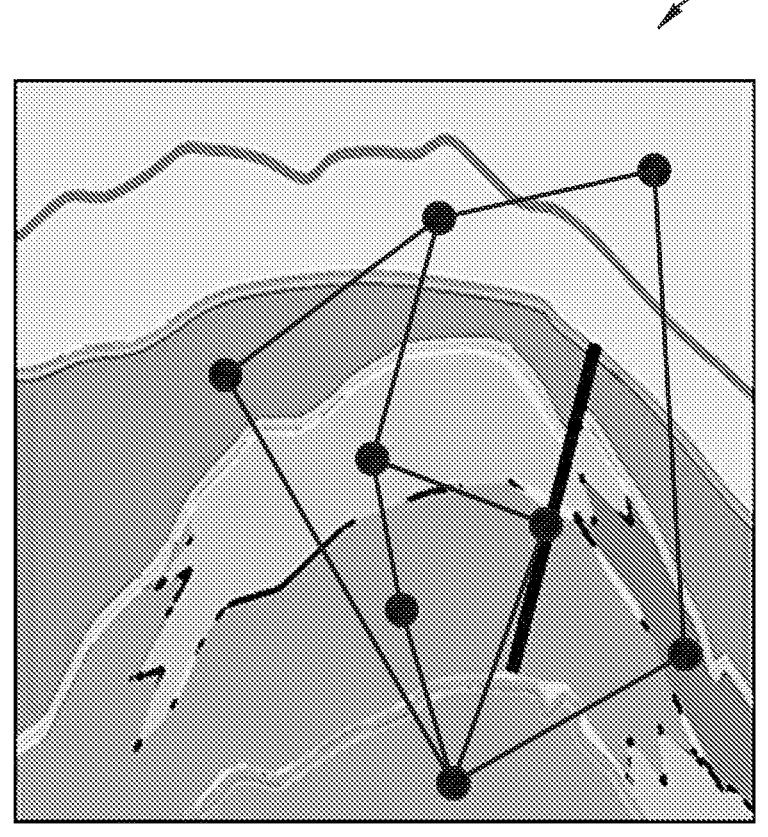
FIG. 5B illustrates the hydrocarbon system from FIG. 1B with another exemplary graph overlay.

Conventional neural networks may operate in a high-dimensional pixel domain, exploiting relationships between neighboring pixels for prediction. Because the pixel domain has high dimensionality, a conventional neural network typically demands many parameters to make the translation to the quantity of interest. Estimation of a large number of parameters involves a large quantity of labeled data, which is typically not available for seismic data. Some embodiments reduce the amount of training data utilized by extracting objects from the pixel data. For example, FIG. 5A illustrates the hydrocarbon system 100-A (from FIG. 1A) with an overlay 500-A of vertices and edges representing the play elements in relation to one another. As another example, FIG. 5B illustrates the hydrocarbon system 100-B (from FIG. 1B) with an overlay 500-B of vertices and edges representing the play elements in relation to one another. The graph network may then perform inference on the objects instead of the pixels.

Conventional neural networks may not generalize well across geological datasets. This is due, at least in part, to variations in geology and seismic acquisition parameters such as resolution and noise characteristics. Embodiments disclosed herein may perform inference on objects, thus being less sensitive to acquisition parameters than pixel-based methods. For example, overall object properties such as total object volume and location do not depend strongly on the seismic resolution or noise level. Moreover, embodiments disclosed herein may utilize graph networks to operate on graphs of different sizes. Such graph networks may achieve good prediction performance, even if the different graph sizes have not been used for training.

Figure 6:
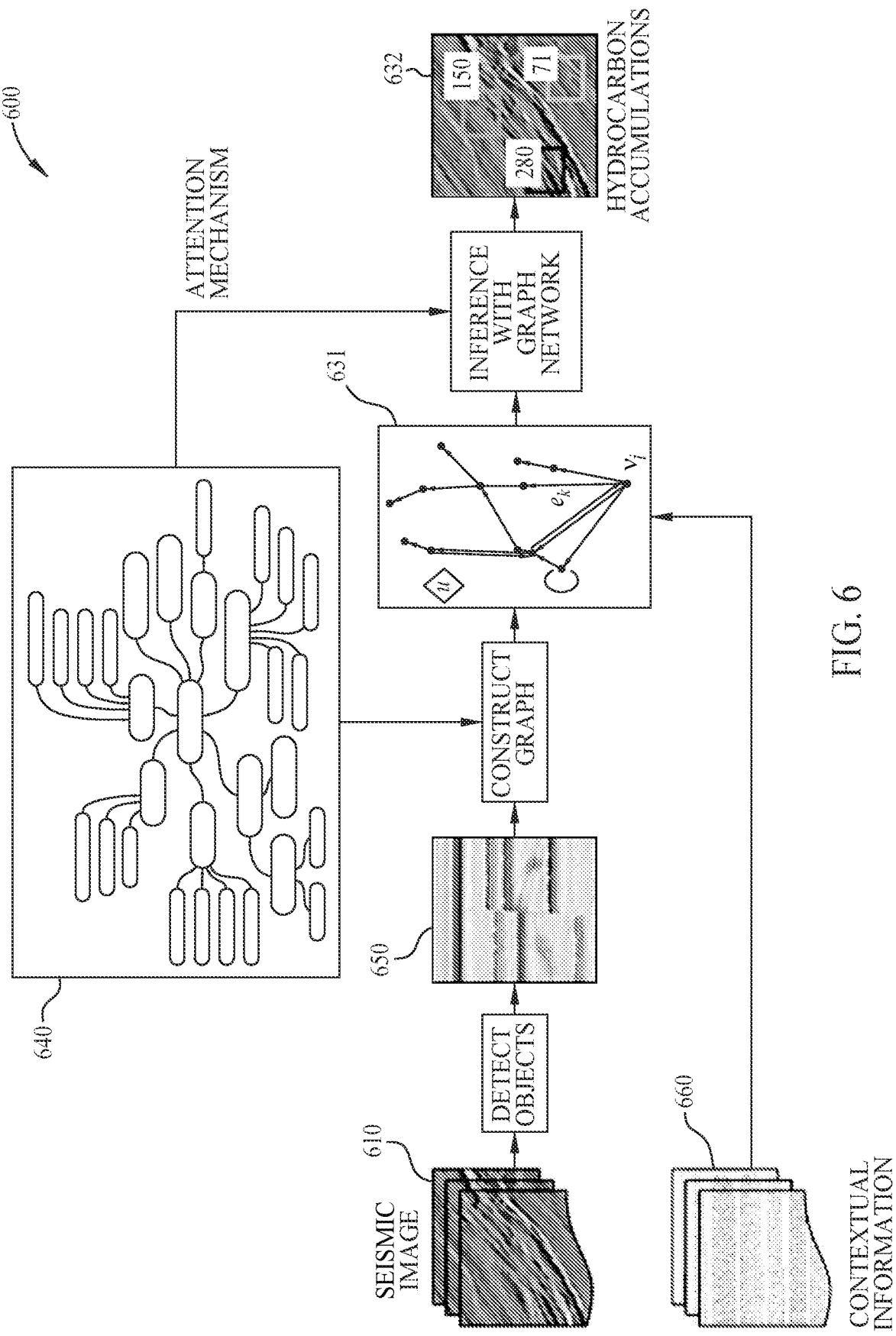
FIG. 6 illustrates a functional diagram of a geological reasoning system utilizing graph networks.

FIG. 6 illustrates a functional diagram of a geological reasoning system 600 utilizing graph networks. Inference performed by geological reasoning system 600 may predict both the categorical identification of play elements and numeric estimation of hydrocarbon accumulation, or rating for the prospect. As illustrated, seismic images 610, similar to hydrocarbon system 100-A of FIG. 1A or hydrocarbon system 100-B of FIG. 1B, may represent geoscientific knowledge. Seismic images 610 may be representative of a subsurface volume. Objects and relationships may be identified in seismic images 610, resulting in labeled images 650, similar to overlay 500-A of FIG. 5A or overlay 500-B of FIG. 5B. The labeled images 650 may represent geologic features for the subsurface volume. In some embodiments, a seismic survey may be conducted to acquire the seismic images 610 (noting that these and other embodiments may also or instead include obtaining other geophysical data in addition or, or instead of, seismic data such as obtaining electrical resistivity measurements). In these and other embodiments, simulation models may be utilized to generate synthetic initial data (e.g., computer simulation). In some embodiments, the initial data may be obtained from a library of data from previous seismic surveys or previous computer simulations. In some embodiments, a combination of any two or more of these methods may be utilized to generate the initial data.

A knowledge model 640 (e.g., ontology 400 of FIG. 4) may be utilized with the labeled images 650 to construct a graph 631, similar to graph 200 of FIG. 2. Additionally, in some embodiments, contextual information documents 660 may be utilized to construct graph 631. Contextual information includes, for example, text and/or visual representations of a known geology of a basin. Contextual information may also include, for example, inductive models based on text and/or visual representations of a known geology of a basin. A trained graph network, similar to graph network 300-A of FIG. 34, and/or a trained graph network block, similar to graph network 300-B of FIG. 3B, may be utilized to perform inference on objects of graph 631. Inference with the graph network produces output graph 632. By performing inference geological reasoning system 600, fewer training instances may be utilized than would be the case with pixel-based methods. Also, performing inference with geological reasoning system 600 may generalize better (than pixel-based methods) to new examples.

In some embodiments, geological reasoning system 600 may be adapted to include a recurrent graph network with an encoder and a decoder, and/or a message-passing graph network.

The output graph 632 may provide, for example, predictions of the hydrocarbon accumulations for each reservoir object. For example, attributes of output graph 632 may include probability-ranked categorical output, such as a confidence measure on the presence of play elements. As another example, attributes of output graph 632 may include numerical quantities, such as porosity, or an estimate of the amount of hydrocarbon accumulations per reservoir object.

Geological reasoning with graph networks may be utilized for geological question answering. For example, performing inference with the trained graph network of geological reasoning system 600 and/or output graph 632 may be utilized to answer questions about the subsurface. Such questions may include, for example: What is the lithology of the subsurface (e.g., carbonate, sand, or volcanic)? What is the crest (e.g., elevation) of the trap? Is the reservoir connected to other reservoirs? Is there an anomalous amplitude consistent with hydrocarbons when compared to modeling of rock physics properties? is there evidence of wet sands (e.g., good porosity but no hydrocarbon indicator) below a direct hydrocarbon indicator? What is the resource density? Is there evidence (e.g., wells, seeps, shallow gas seismic hydrocarbon indicators) for a hydrocarbon system in the basin? What is the environment of deposition of the reservoir?

Figure 7:
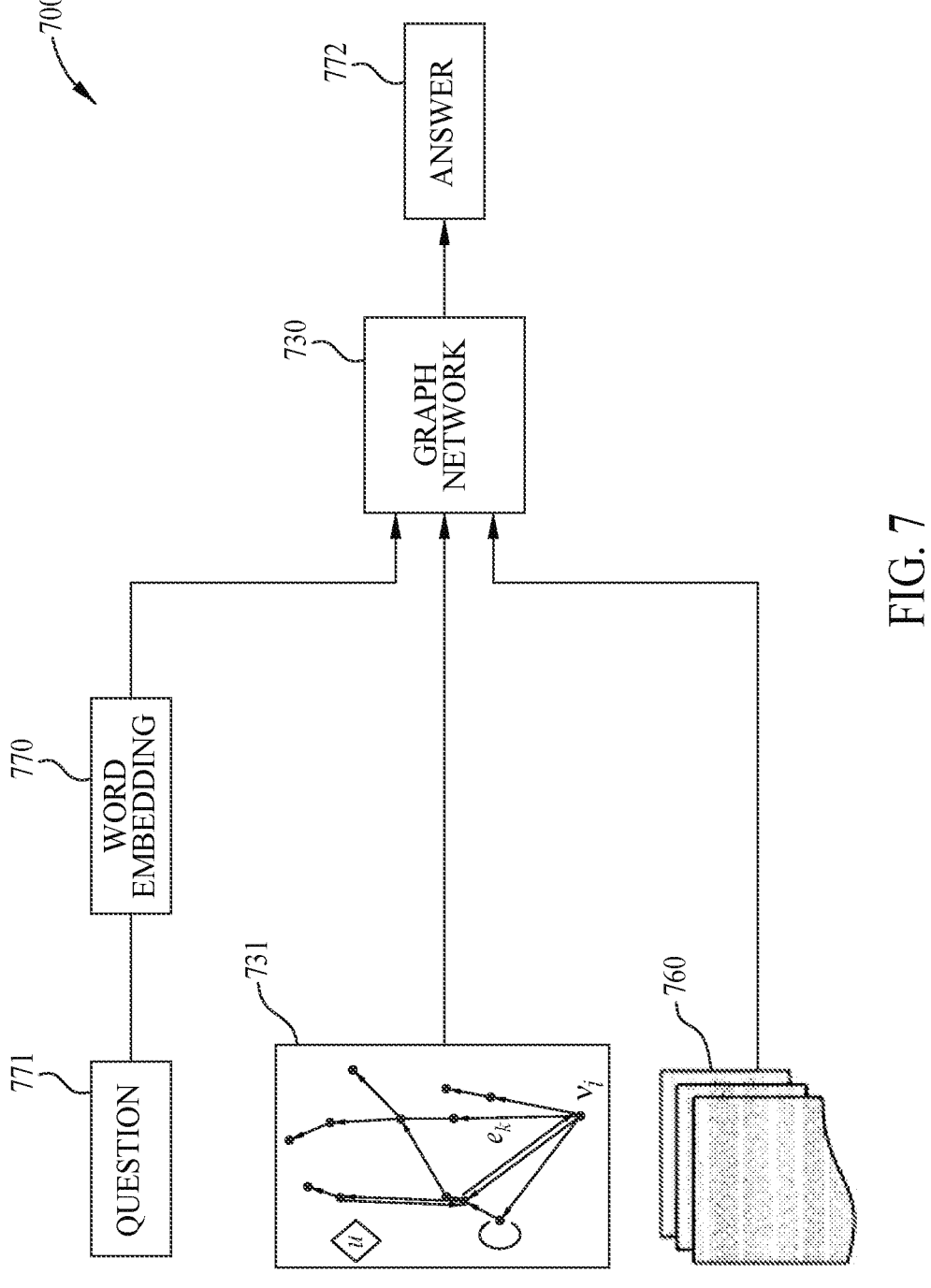
FIG. 7 illustrates an exemplary visual question answering system.

In some embodiments, a trained graph network may be utilized for geological reasoning with a question answering system (e.g., a visual question answering (VQA) system) An exemplary question answering system 700 is illustrated in FIG. 7. As illustrated, geological questions 771 (e.g., "What is the crest of the trap?") may be converted into a numerical representation using word embedding 770. In some embodiments, image data related to objects in the image (e.g., play elements) may be utilized to predict answers 772 to the geological questions 771. In some embodiments, a structured representation may be utilized to improve the accuracy, precision, and/or efficiency of the question answering system 700. For example, a graph representation may be included to predict the presence of play elements in the image data.

As illustrated, input graph 731 is the output graph 632 of FIG. 6. Consequently, input graph 731 includes object attributes providing an estimate of the probability of the object being a given play element (e.g., is_trap). Graph network 730 may be trained by emphasizing attributes for nodes that have high values for such play elements (e.g., is_trap). For example, a prior parameter may be put on the coefficients for the attention mechanism. As another example, regularization may be added to network parameters θ of graph network 730 to emphasize predictions based on nodes with high values for such play elements (e.g., is_trap). Question answering system 700 also includes contextual information documents 760. For geological questions 771 that do not involve a specific play element (e.g., What is the lithology?), the context information coming from the documents 760 can be emphasized.

More generally, the graph network 730 may be trained to emphasize attributes that are related to the geological question 771 through a knowledge model (e.g., a geoscience ontology or a set of rules). For example, if the geological question 771 is "From where was the reservoir charged?", graph network 730 may be trained to put an emphasis on node attributes related to "source" and "migration pathway" because sources and migration pathways are related to the "charged" concept in the knowledge model.

The training data may be provided by reliable experimental data. The training data may be provided by simulation data. The training data may be a combination of experimental data and simulation data. The simulation data may be generated using a generative model that was trained from a limited number of templates. In this way, a diversity of training data may be generated to train a graph network to predict multiple scenarios.

In practical applications, the present technological advancement may be used in conjunction with a seismic data analysis system (e.g., a high-speed computer) programmed in accordance with the disclosures herein. Preferably, in order to efficiently perform geological reasoning according to various embodiments herein, the seismic data analysis system is a high performance computer (HPC), as known to those skilled in the art. Such high performance computers typically involve clusters of nodes, each node having multiple CPUs and computer memory that allow parallel computation. The models may be visualized and edited using any interactive visualization programs and associated hardware, such as monitors and projectors. The architecture of the system may vary and may be composed of any number of suitable hardware structures capable of executing logical operations and displaying the output according to the present technological advancement. Those of ordinary skill in the art are aware of suitable supercomputers available from Cray or IBM.

As will be appreciated from the above discussion, in certain embodiments of the present approach, expert inputs are elicited that will have the most impact on the efficacy of a learning algorithm employed in the analysis, such as a classification or ranking algorithm, and which may involve eliciting a judgment or evaluation of classification or rank (e.g., right or wrong, good or bad) by the reviewer with respect to a presented query. Such inputs may be incorporated in real time in the analysis of seismic data, either in a distributed or non-distributed computing framework. In certain implementations, queries to elicit such input are generated based on a seismic data set undergoing automated evaluation and the queries are sent to a workstation for an expert to review.

Figure 8:
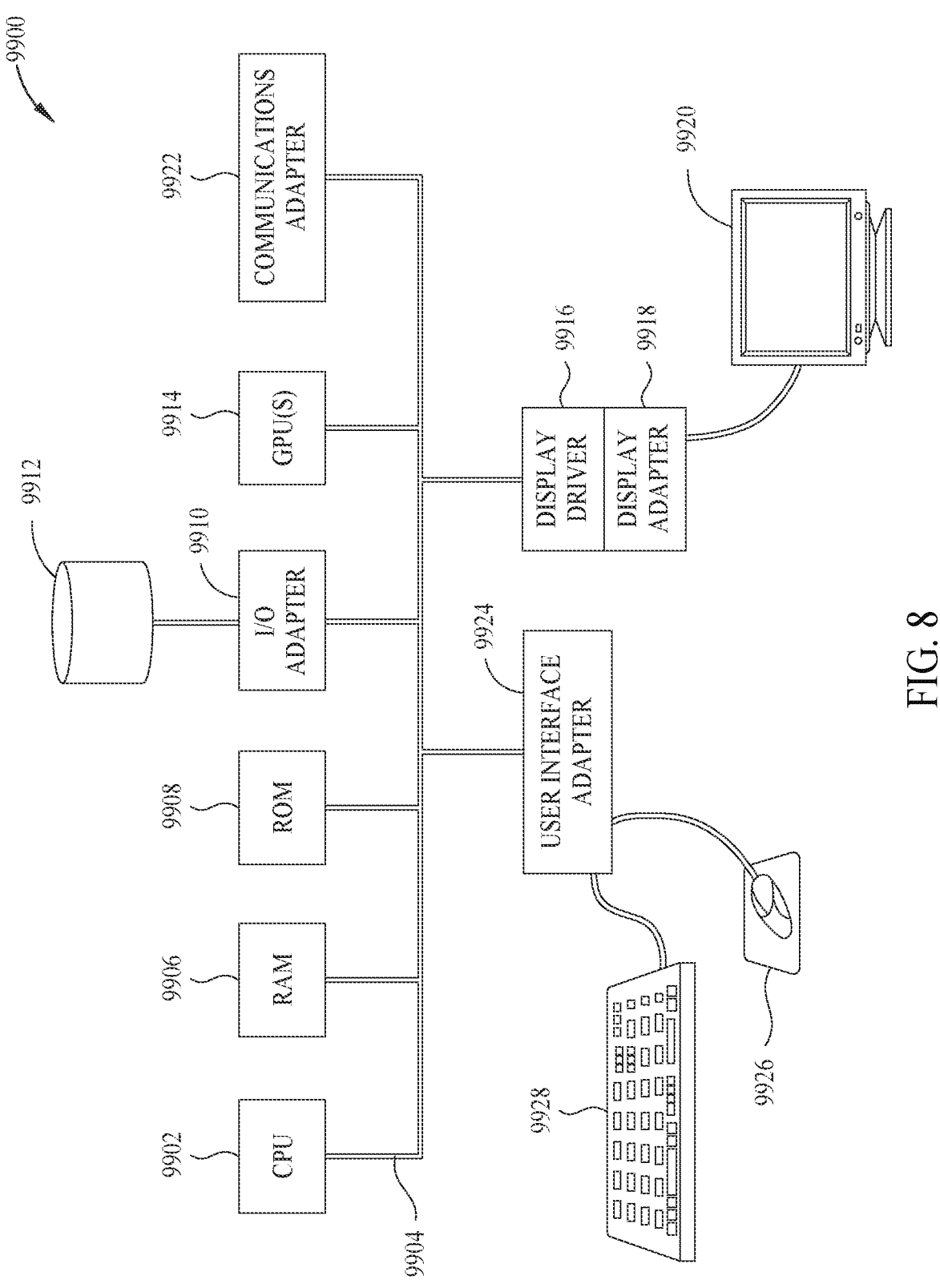
FIG. 8 illustrates a block diagram of a seismic data analysis system upon which the present technological advancement may be embodied.

FIG. 8 illustrates a block diagram of a seismic data analysis system 9900 upon which the present technological advancement may be embodied. A central processing unit (CPU) 9902 is coupled to system bus 9904. The CPU 9902 may be any general-purpose CPU, although other types of architectures of CPU 9902 (or other components of exemplary system 9900) may be used as long as CPU 9902 (and other components of system 9900) supports the operations as described herein. Those of ordinary skill in the art will appreciate that, while only a single CPU 9902 is shown in FIG. 8, additional CPUs may be present. Moreover, the system 9900 may comprise a networked, multi-processor computer system that may include a hybrid parallel CPU/GPU system. The CPU 9902 may execute the various logical instructions according to various teachings disclosed herein. For example, the CPU 9902 may execute machine-level instructions for performing processing according to the operational flow described.

The seismic data analysis system 9900 may also include computer components such as non-transitory, computer-readable media. Examples of computer-readable media include a random access memory (RAM) 9906, which may be SRAM, DRAM, SDRAM, or the like. The system 9900 may also include additional non-transitory, computer-readable media such as a read-only memory (ROM) 9908, which may be PROM, EPROM, EEPROM, or the like. RAM 9906 and ROM 9908 hold user and system data and programs, as is known in the art. The system 9900 may also include an input/output (I/O) adapter 9910, a communications adapter 9922, a user interface adapter 9924, and a display adapter 9918; the system 9900 may potentially also include one or more graphics processor units (GPUs) 9914, and one or more display drivers 9916.

The I/O adapter 9910 may connect additional non-transitory, computer-readable media such as storage device(s) 9912, including, for example, a hard drive, a compact disc (CD) drive, a floppy disk drive, a tape drive, and the like to seismic data analysis system 9900. The storage device(s) may be used when RAM 9906 is insufficient for the memory requirements associated with storing data for operations of the present techniques. The data storage of the system 9900 may be used for storing information and/or other data used or generated as disclosed herein. For example, storage device(s) 9912 may be used to store configuration information or additional plug-ins in accordance with the present techniques. Further, user interface adapter 9924 couples user input devices, such as a keyboard 9928, a pointing device 9926 and/or output devices to the system 9900. The display adapter 9918 is driven by the CPU 9902 to control the display on a display device 9920 to, for example, present information to the user. For instance, the display device may be configured to display visual or graphical representations of any or all of the models discussed herein (e.g., graphs, seismic images, feature probability maps, feature objects, predicted labels of geologic features in seismic data, etc.). As the models themselves are representations of geophysical data, such a display device may also be said more generically to be configured to display graphical representations of a geophysical data set, which geophysical data set may include the models and data representations (including models and representations labeled with features predicted by a trained machine learning model) described herein, as well as any other geophysical data set those skilled in the art will recognize and appreciate with the benefit of this disclosure.

The architecture of seismic data analysis system 9900 may be varied as desired. For example, any suitable processor-based device may be used, including without limitation personal computers, laptop computers, computer work-stations, and multi-processor servers. Moreover, the present technological advancement may be implemented on application specific integrated circuits (ASICs) or very large scale integrated (VLSI) circuits. In fact, persons of ordinary skill in the art may use any number of suitable hardware structures capable of executing logical operations according to the present technological advancement. The term "processing circuit" encompasses a hardware processor (such as those found in the hardware devices noted above). ASICs, and VLSI circuits. Input data to the system 9900 may include various plug-ins and library files. Input data may additionally include configuration information.

Seismic data analysis system 9900 may include one or more machine learning architectures, such as neural networks, graph neural networks, RNNs, convolutional neural networks, VQAs, encoders/decoders, etc. The machine learning architectures may be trained on various training data sets, e.g., as described in connection with various methods herein. The machine learning architectures may be applied to analysis and/or problem solving related to various unanalyzed data sets (e.g., test data such as acquired seismic or other geophysical data as described herein). It should be appreciated that the machine learning architectures perform training and/or analysis that exceed human capabilities and mental processes. The machine learning architectures, in many instances, function outside of any preprogrammed routines (e.g., varying functioning dependent upon dynamic factors, such as data input time, data processing time, data set input or processing order, and/or a random number seed). Thus, the training and/or analysis performed by machine learning architectures is not performed by predefined computer algorithms and extends well beyond mental processes and abstract ideas.

The above-described techniques, and/or systems implementing such techniques, can further include hydrocarbon management based at least in part upon the above techniques. For instance, methods according to various embodiments may include managing hydrocarbons based at least in part upon geological reasoning graphs and graph networks constructed according to the above-described methods. In particular, such methods may include drilling a well, and/or causing a well to be drilled, based at least in part upon the output of a geological graph network (e.g., such that the well is located based at least in part upon a location determined from the output graph, which location may optionally be informed by other inputs, data, and/or analyses, as well) and further prospecting for and/or producing hydrocarbons using the well.

The foregoing description is directed to particular example embodiments of the present technological advancement. It will be apparent, however, to one skilled in the art, that many modifications and variations to the embodiments described herein are possible. All such modifications and variations are intended to be within the scope of the present disclosure, as defined in the appended claims.

The invention claimed is:

1. A computer-implemented method for hydrocarbon identification and prospection comprising:
  accessing subsurface data for a subsurface region, wherein the subsurface data comprises one or more seismic images;
  accessing a knowledge model;
  generating one or more labeled images by identifying objects and relationships in the one or more seismic images;

extracting, from the one or more labeled images using the knowledge model, a structured representation comprising a graph;
  performing geological reasoning with a trained graph network based on the knowledge model and the graph;
  performing, using the geological reasoning, hydrocarbon identification and hydrocarbon production or hydrocarbon extraction;
  wherein the graph comprises objects being vertices in the graph and representing play elements indicative of hydrocarbon system elements in the subsurface and edges connecting respective vertices and representing relationships between the respective vertices, wherein the edges between different pairs of the respective vertices are non-uniform; and
  wherein the trained graph network performs inference on the objects.

2. The method of claim 1, wherein the knowledge model comprises a set of geoscience rules or a geoscience ontology.

3. The method of claim 2, wherein performing geological reasoning comprises answering a geological question with a question answering system.

4. The method of claim 3, further comprising receiving the geological question from a user.

5. The method of claim 3, wherein the question answering system is a visual question answering system.

6. The method of claim 1, wherein the graph network comprises trained parameters;
  wherein the trained parameters are obtained from a model that is trained using geological play elements as target variables; and
  wherein the model is trained by fitting to a set of training data generated from a synthetic subsurface model.

7. The method of claim 6, wherein, for each respective vertex of the vertices, a vector of probabilities, generated by the trained graph network, indicative of the respective vertex representing a respective play element, thereby generating a plurality of probability graphs; and
  further comprising generating, based on the plurality of probability graphs, multiple geological scenarios.

8. The method of claim 7, wherein generating multiple geological scenarios utilizes a graph network to produce a graph of dependent variables to express the multiple geological scenarios.

9. The method of claim 8, wherein the dependent variables are randomized.

10. The method of claim 7, wherein the multiple geological scenarios express probabilities of an amount of hydrocarbon present in the subsurface region.

11. The method of claim 10, wherein:
  the structured representation comprises an input graph, and
  performing geological reasoning comprises:
    performing a first inference with the graph network to categorically identifying play elements associated with various regions of the input graph; and
    performing a second inference with the graph network to predict numeric estimations of amounts of hydrocarbon accumulation associated with various regions of the input graph.

12. The method of claim 11, wherein:
  the first inference utilizes a first set of trained parameters,
  the second inference utilizes a second set of trained parameters, and
  the first set and the second set share at least a subset of trained parameters.

13. The method of claim 1, wherein performing hydrocarbon extraction comprises one or both of drilling a well or producing hydrocarbons using the well.

14. The method of claim 1, wherein the respective vertices define an edge; and wherein graph network includes an edge update function that extracts a number of deposition layers traversed by an edge attribute of the edge.

15. The method of claim 1, wherein performing geological reasoning with the trained graph network based on the knowledge model and the structured representation comprises updating, using the trained graph network, the graph with new attributes.

16. The method of claim 15, wherein the vertices in the graph comprise reservoir vertices; and wherein updating the graph with the new attributes comprises predicting an amount of hydrocarbon accumulations for the reservoir vertices.

17. The method of claim 1, wherein the trained graph network inputs the graph and generates:

a first output graph categorically identifying the play elements associated with a plurality of regions of the graph as an overlay of a respective seismic image; and a second generate output graph identifying numeric estimations of amount of hydrocarbon accumulation in each of the plurality of regions of the respective seismic image.

18. The method of claim 1, wherein the one or more labeled images comprise overlays on the one or more seismic images.

19. The method of claim 1, wherein the objects comprise reservoir objects; and wherein the trained graph network generates an output graph that comprises an overlay on a respective seismic image that indicates predictions of hydrocarbon accumulations for the reservoir objects.

20. The method of claim 19, wherein the output graph comprise attributes indicating probability-ranked categorical output comprising a confidence measure on presence of the play elements and attributes of porosity and an estimate of an amount of hydrocarbon accumulations per reservoir object.

21. The method of claim 19, wherein the output graph is input to an additional graph network trained to emphasize one or more attributes that are related to a geological question through a knowledge model.

22. The method of claim 21, wherein the output graph that is input to the additional graph network includes object attributes providing an estimate of probability of a respective object being a respective hydrocarbon system element; and wherein the additional graph network is trained to emphasize attributes for nodes that have high values for being the respective hydrocarbon system element.

23. The method of claim 22, wherein the respective hydrocarbon system element comprises a trap.

* * * * *